United States Patent
Dochev et al.

(10) Patent No.: US 10,177,243 B1
(45) Date of Patent: Jan. 8, 2019

(54) EXTENDED DRAIN NMOS TRANSISTOR WITH BURIED P TYPE REGION

(71) Applicant: NXP B.V., Eindhoven (NL)

(72) Inventors: Dimitar Milkov Dochev, Nijmegen (NL); Arnold Benedictus Van Der Wal, Portland, OR (US); Maarten Jacobus Swanenberg, Berg en Dal (NL)

(73) Assignee: NXP B.V., Eindhoven (NL)

( * ) Notice: Subject to any disclaimer, the term of this patent is extended or adjusted under 35 U.S.C. 154(b) by 68 days.

(21) Appl. No.: 15/626,278

(22) Filed: Jun. 19, 2017

(51) Int. Cl.
  *H03K 17/687* (2006.01)
  *H01L 29/66* (2006.01)
  *H01L 29/78* (2006.01)

(52) U.S. Cl.
  CPC .... *H01L 29/66681* (2013.01); *H01L 29/7824* (2013.01)

(58) Field of Classification Search
  None
  See application file for complete search history.

(56) References Cited

U.S. PATENT DOCUMENTS

| | | | |
|---|---|---|---|
| 5,382,818 A | 1/1995 | Pein | |
| 8,772,870 B2 | 7/2014 | Ren et al. | |
| 9,105,657 B2 | 8/2015 | Yang et al. | |
| 9,159,803 B2 | 10/2015 | Min et al. | |
| 9,306,060 B1* | 4/2016 | Yang | H01L 29/7823 |
| 9,484,454 B2 | 11/2016 | Levy et al. | |
| 9,653,642 B1* | 5/2017 | Raring | H01L 33/0075 |
| 2007/0120187 A1* | 5/2007 | Udrea | H01L 29/0653 257/347 |
| 2011/0309442 A1 | 12/2011 | Grote et al. | |
| 2012/0112280 A1* | 5/2012 | Johnson | H01L 21/76237 257/347 |
| 2013/0146974 A1* | 6/2013 | Kim | H01L 29/7801 257/335 |

(Continued)

FOREIGN PATENT DOCUMENTS

| | | |
|---|---|---|
| CN | 102157383 B | 9/2012 |
| WO | 2013024677 A1 | 2/2013 |

OTHER PUBLICATIONS

Guoliang, Y., "Novel SOI double-gate MOSFET with a P-type buried layer", Journal of Semiconductors, vol. 33, No. 5, May 2012.

(Continued)

*Primary Examiner* — Lincoln Donovan
*Assistant Examiner* — Khareem E Almo
(74) *Attorney, Agent, or Firm* — David G. Dolezal

(57) ABSTRACT

Described herein is an N type extended drain transistor formed from a semiconductor on insulator (SOI) wafer. The transistor has a buried P type region formed by the selective implantation of P type dopants in a semiconductor layer of the wafer at a location directly below a drift region of the transistor. The transistor also includes a source located in a P well region and a drain. The buried P type region is in electrical contact with the P well region. The N type drift region, the source, and the drain are also located in a portion of the semiconductor layer surrounded by dielectric isolation. A buried dielectric layer located below the portion of the semiconductor layer electrically isolates the portion of the semiconductor layer from a semiconductor substrate located below the buried dielectric layer.

20 Claims, 6 Drawing Sheets

(56) References Cited

U.S. PATENT DOCUMENTS

| | | | |
|---|---|---|---|
| 2013/0193509 A1* | 8/2013 | Luo | H01L 27/1203 257/330 |
| 2014/0035047 A1 | 2/2014 | Korec et al. | |
| 2015/0380398 A1 | 12/2015 | Mallikarjunaswamy | |
| 2017/0222042 A1* | 8/2017 | Lee | H01L 29/7824 |

OTHER PUBLICATIONS

Letavic, T., "High Performance 600 V Smart Power Technology Based on Thin Layer Silicon-on-Insulator", IEEE, 1997.

Yang, H., "Approach to the Silicon Limit: Advanced NLDMOS in 0.13 μm SOI Technology for Automotive and Industrial Applications up to 110V", Proceedings of the 25th International Symposium on Power Semiconductor Devices & ICs, Kanazawa, May 26-30, 2013.

Toulon, G., "LUDMOS transistors optimization on a 0.18um SOI CMOS technology", 13th European Conference on Power Electronics and Applications, 2009.

Yang, S., "Dependence of Breakdown Voltage on Drift Length and Linear Doping Gradients in SOI RESURF LDMOS Devices", The Ninth International Conference on Electronic Measurement & Instruments, ICEMI, 2009.

* cited by examiner

EXTENDED DRAIN NMOS TRANSISTOR WITH BURIED P TYPE REGION

BACKGROUND OF THE INVENTION

Field of the Invention

This invention relates in general to transistors and more specifically to an N type extended drain transistor with a buried P type region.

Description of the Related Art

An extended drain transistor, such as a laterally diffused MOSFET (LDMOS), generally includes a drain region that is electrically spaced apart from a channel region by a drift region. When in a conductive state, the charge carriers flow from the source, through the channel region, through the drift region, to the drain region. Extended drain transistors are typically used in high frequency and/or high voltage applications such as for high power RF amplifiers, power switches, and power supplies. In some embodiments, an N type extended drain transistor can be implemented in an P type epi body region formed over a buried dielectric layer.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates identical items unless otherwise noted. The Figures are not necessarily drawn to scale.

DETAILED DESCRIPTION

The following sets forth a detailed description of a mode for carrying out the invention. The description is intended to be illustrative of the invention and should not be taken to be limiting.

Described herein is an N type extended drain transistor formed from a semiconductor on insulator (SOI) wafer. The transistor has a buried P type region formed by the implantation of P type dopants in a semiconductor layer of the wafer at a location directly below a drift region of the transistor. The transistor also includes a source located in a P well region and a drain. The buried P type region is in electrical contact with the P well region. The N type drift region, the source, and the drain are also located in a portion of the semiconductor layer that is laterally surrounded by dielectric isolation. The semiconductor layer has a thickness of 2 microns or less.

In one embodiment, the buried P type region has a net conductivity of P type dopants at a sufficient concentration to ensure full drift region depletion under reverse drain bias when the substrate is biased at a higher voltage than the source of the transistor. The buried P type region has a sufficient doping to provide an additional mechanism for depleting the N type drift region from the bottom counteracting the higher substrate bias voltage. In some embodiments, providing a buried P type region of sufficient doping allows for a fully depleted drift region under such conditions where the transistor body thickness (the thickness of the semiconductor layer) is relatively thin (e.g. as compared to the thickness of the buried dielectric layer) when the substrate voltage is higher than the source voltage. In one embodiment, the semiconductor layer has a first thickness and is located above a buried dielectric layer of the SOI wafer that has a second thickness. The first thickness being in a range from 5 times greater or less than the second thickness.

Figure 1:
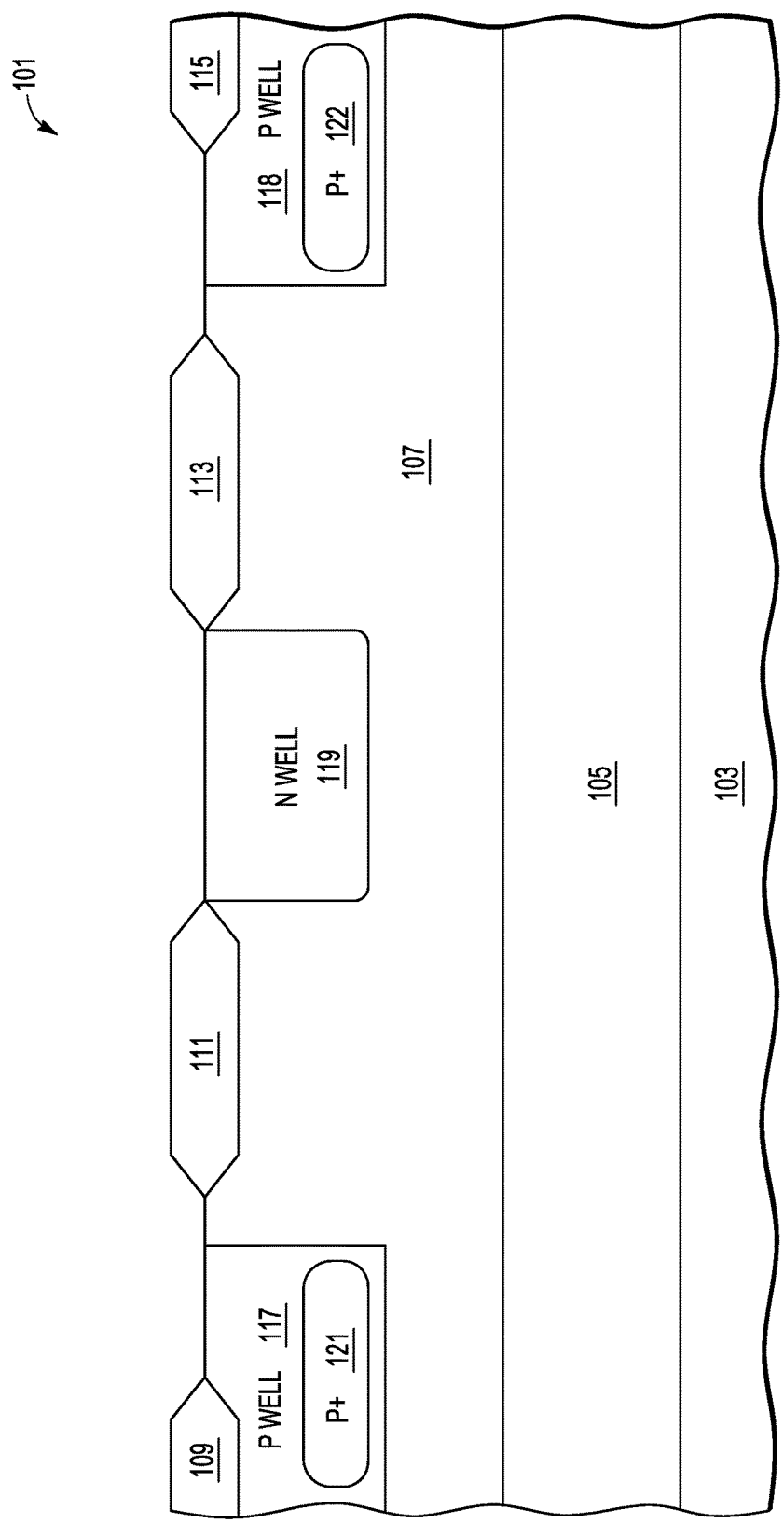
FIGS. 1-4 are partial cutaway side views of a wafer during various stages in the manufacture of a transistor according to one embodiment of the present invention.

FIG. 1 is a partial cross sectional side view of a wafer 101 during a stage in a manufacture of an N type extended drain transistor according to one embodiment of the present invention. Wafer 101 includes a substrate 103 of a mono crystalline semiconductor material (e.g. silicon) which has specific crystal orientation (e.g. <100>). In FIG. 1, only a top portion of substrate 103 is shown. A buried dielectric layer 105 (e.g. oxide) is located on substrate 103. A semiconductor layer 107 is located over layer 105. In one embodiment, layer 107 is a monocrystalline semiconductor material (e.g. silicon) that is formed by a smart cut process (e.g. transferred monocrystalline silicon from another wafer. However, in other embodiments, layer 107 may be formed by a different process (e.g. epitaxially grown). In one embodiment, at this stage, layer 107 has net P type doping concentration of $1\times10^{15}$ cm$^{-3}$. However, layer 107 may be made of different materials and/or have different doping profiles in other embodiments.

In some embodiments, layer 105 has a thickness in the range of 0.3-3 microns and layer 107 has a thickness in the range of 0.1-2 microns. In one specific example, layer 105 is 1.0 microns thick and layer 107 is 1.4 microns thick. In some embodiments, layer 107 has a thickness in the range of 5 times greater or less the thickness of layer 105. However, in other embodiments, layers 105 and 107 maybe of other thicknesses. In other embodiments, layer 107 can be made of multiple layers of semiconductor material.

In some embodiments where layer 107 has a net P type doping concentration, an N-type dopant (e.g. phosphorous) is implanted in layer 107 to give layer 107 a net N type doping profile. In one embodiment, the N type dopant is implanted at a dose in the range of $1\times10^{12}$ to $1\times10^{13}$ cm$^{-2}$ and at an energy in the range of 90 to 130 KeV. After implantation, the wafer is annealed to activate the dopants.

Isolation structures 109, 111, 113, and 115 are formed at the upper portion of layer 107. In one embodiment, structures 109, 111, 113, and 115 are made of oxide and are formed by a LOCOS process. However, in other embodiments, these isolation structures may be formed by other processes and/or be made of other dielectric materials. In one example, the isolation structures can be formed by forming trenches in layer 107 and filling the trenches with a dielectric material. In the embodiment shown, dielectric structures 109, 111, 113, and 115 are separate structures. However, in other embodiments, these structures may be physically joined at one or more locations. For example, structures 111 and 113 may be part of a "doughnut shaped" isolation structure.

P well regions 117 and 118 are formed by one or more implants of P type dopants. An initial selective implantation of boron at a dose in the range of $1\times10^{12}$ to $1\times10^{13}$ cm$^{-2}$ and at energy in the range of 150 to 250 KeV implants dopants into all of P well regions 117 and 118 through openings in a patterned mask (not shown) on wafer 101. A second higher concentration of P type dopants forms the deep implanted regions 121 and 122 of P well regions 117 and 118, respectively. In one embodiment, these additional implants at a higher dose and a lower energy are added for improved robustness. In other embodiments, P well regions 117 and 118 may be formed by other processes, include a different number of implantation steps, and/or be implanted at different energies and/or different doses.

N well region 119 is formed by the selective implantation of an N type dopant (e.g. phosphorous, arsenic) at a dose in the range of $1\times10^{12}$ to $1\times10^{13}$ cm$^{-2}$ and an energy in a range of 400 to 500 KeV through a patterned mask (not shown) formed on wafer 101. However, in other embodiments, N well region 119 may be formed at other doses and/or other energies. In one embodiment, the ions forming P well regions 117 and 118 are implanted deeper than the ions forming N well region 119. The implantation steps for forming the regions of FIG. 1 can be performed in any order.

Figure 2:
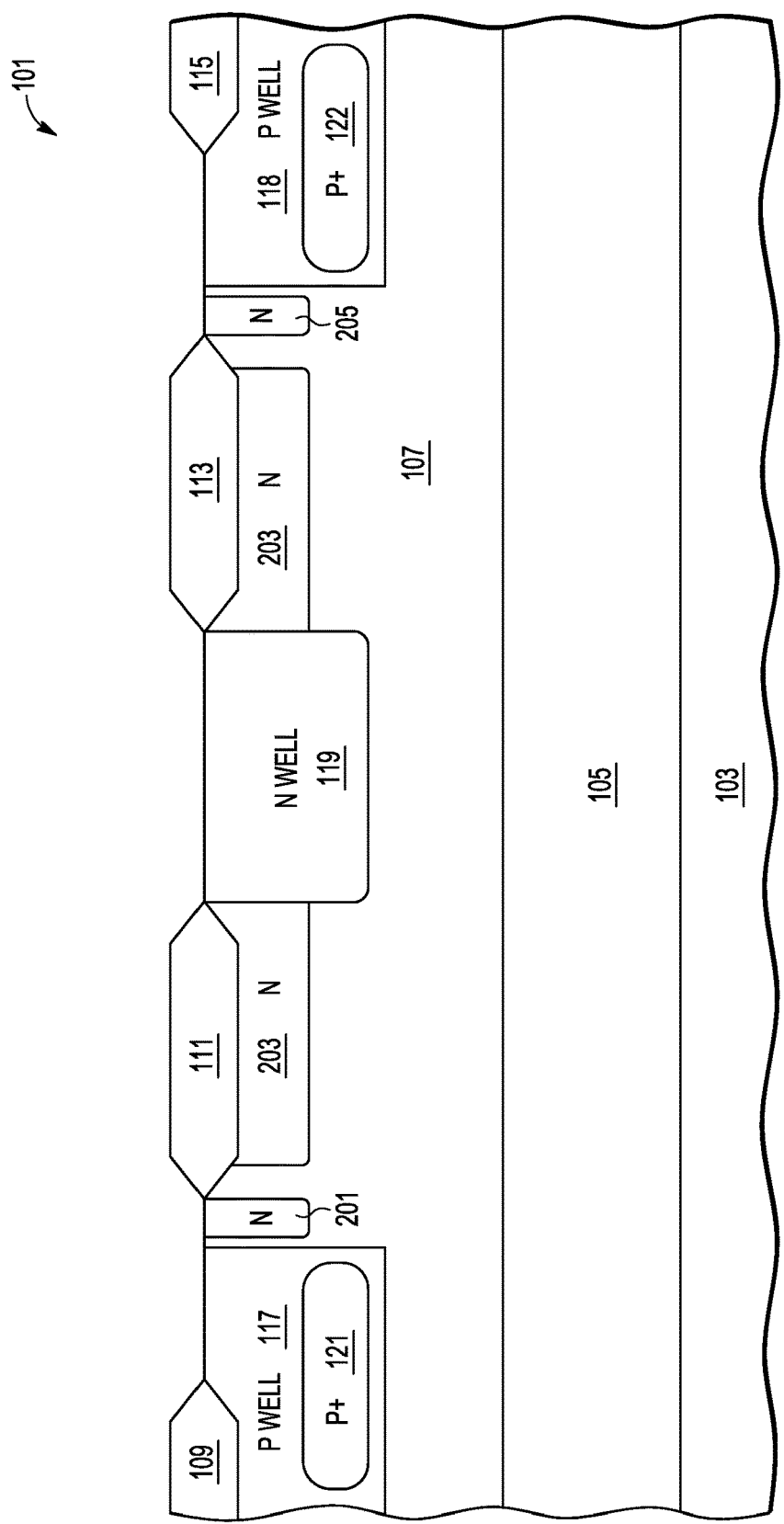

FIG. 2 is a partial cross sectional side view of wafer 101 at a subsequent stage during its manufacture. N type drift regions 201, 203, and 205 are formed by the selective implantation of N type ion dopants into layer 107. In one embodiment, N type ions (e.g. phosphorous, arsenic) are implanted into layer 107 at an energy in the range of 200 to 250 keV and a dose in the range of $5\times10^{11}$ to $5\times10^{12}$ cm$^{-2}$, but may be implanted at other energies and/or other dosages in other embodiments. In the embodiment shown, separate N type drift regions 201 and 205 are formed from N type drift region 203 to minimize the transistor on-state resistance. However, in other embodiments, regions 201 and 205 are not present. In the embodiment shown, region 203 has an oval doughnut shape that surrounds N well region 119. However, in other embodiments, each side of region 203 in FIG. 2 may be physically separate regions.

In some embodiments, after the formation of drift regions 201, 203, and 205, a shallow implant of P type dopant ions (not shown) is made to adjust the voltage threshold of subsequently formed transistors on wafer 101.

Figure 3:
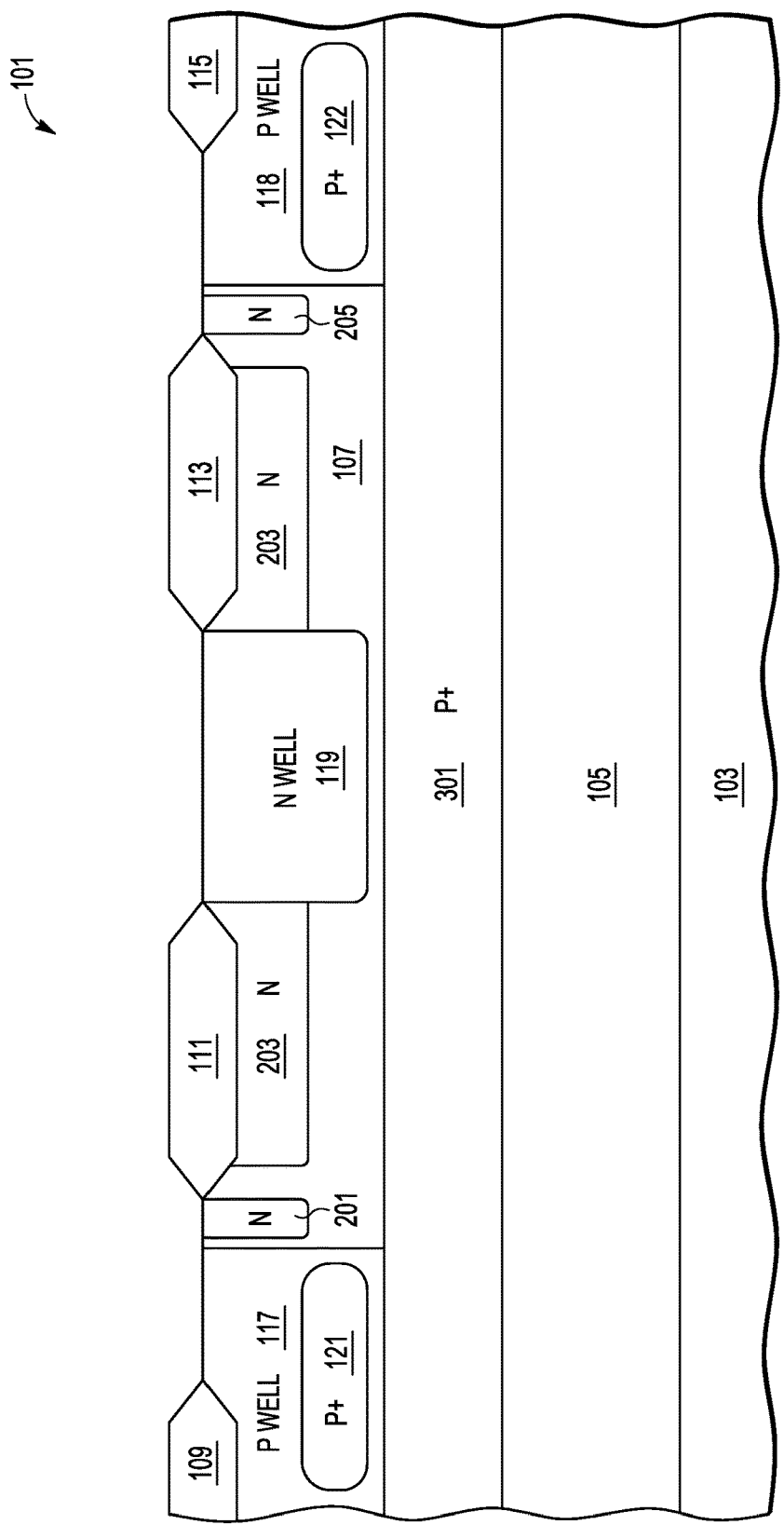

FIG. 3 shows a partial cutaway side view after P type dopant ions (e.g. boron) are implanted to form buried P type region 301. In one embodiment, the P type ions are implanted at an energy in the range 550 to 650 keV and at a dose in the range of $1\times10^{12}$ to $1\times10^{13}$ cm$^{-2}$, but may be implanted at other energies and/or other dosages in other embodiments. In some embodiments, the implant energy may depend on the thickness of layer 107. After implantation, the dopants are activated by an anneal of wafer 101.

In the embodiment shown, region 301 extends from the top surface of buried dielectric layer 105 to the bottom of P well regions 117 and 118 to where region 301 is in electrical contact with regions 117 and 118. Because N well region 119 and drift region 203 are not as deep as regions 117 and 118, buried P type region 301 does not contact N well region 119 or drift region 203 in the embodiment shown. In one embodiment, region 301 has a thickness in the range of 0.1 to 0.5 microns (e.g. 0.4 microns) but may have other thicknesses in other embodiments. In one embodiment, the thickness of region 301 is in the range of 0.1 to 0.3 of the thickness of layer 107, but may be of other ratios in other embodiments.

Figure 4:
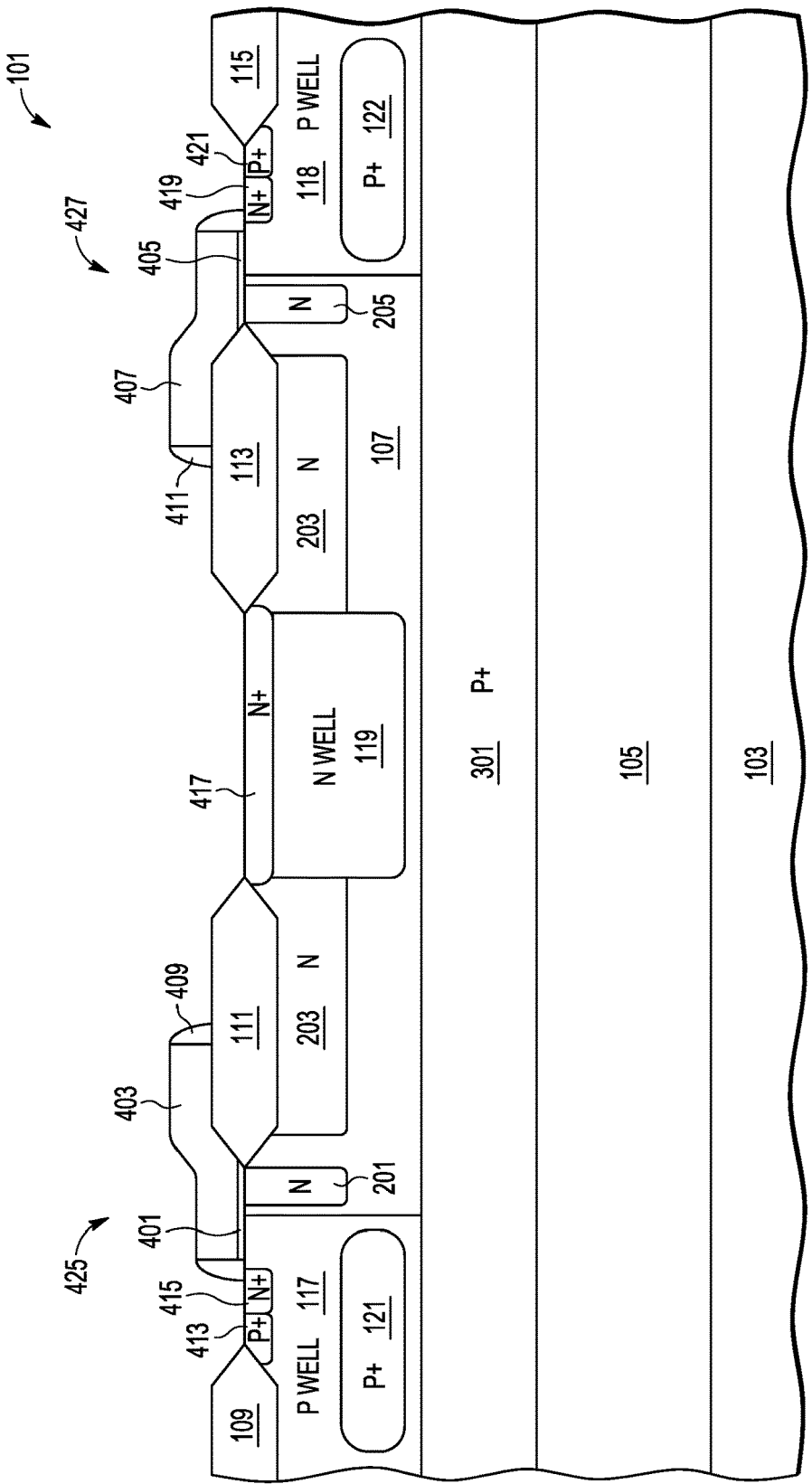

FIG. 4 is a partial cutaway side view of wafer 101 after gates 403 and 407 are formed. In one embodiment, gates 403 and 407 are formed by forming a layer of polysilicon or other gate material over wafer 101 and then patterning the layer of polysilicon with a photolithographic process. Prior to forming the layer of gate material, layer 107 is oxidized to form a layer of oxide that is patterned with the layer of gate material to form gate dielectrics 401 and 405. In one embodiment, the dielectrics 401 and 405 have a thickness in the range of 5 to 10 nm, but may have other thicknesses in other embodiments. In other embodiments, the gate dielectric layer may be formed from a deposition process where the layer of gate dielectric material is deposited on wafer 101.

After the formation of gates 403 and 407, side wall spacers 409 and 411 are formed on the side walls of gates 407 and 407, respectively. In one embodiment, sidewall spacers 409 and 411 are made of nitride and are formed from the anisotropic etching of a layer of nitride formed on wafer 101.

After the formation of spacers 409 and 411, source regions 415 and 419 and drain region 417 are formed by the implantation of N type dopant ions in wafer 101, followed by an anneal of wafer 101. In one embodiment, regions 415, 419, and 417 are formed by the selective implant of N type dopant ions into wafer 101 at a dose in the range of $5\times10^{14}$ to $5\times10^{15}$ cm$^{-2}$ and at an energy in the range 20-60 KeV, but may be formed of other doses and at other energies in other embodiments.

In the embodiment shown, P type dopant ions (e.g. Boron) are selectively implanted through a patterned mask (not shown) to form body contact regions 413 and 421 that are adjacent to source regions 415 and 419, respectively. Silicide structures (not shown) are formed on wafer 101 to be in electrical contact with both the adjacent source and body contact regions to bias the body contact and source regions at the same potential during operation. However, in other embodiments, the body contact regions 413 and 421 may be located separately from the source regions 415 and 419 and may be biased at a different voltage than the source regions.

Two transistors 425 and 427 are shown in FIG. 4. Transistor 425 includes gate 403, source region 415, body contact region 413, drain region 417, and drift regions 201 and 203. Transistor 427 includes gate 407, source region 419, body contact region 421, drain region 417, and drift regions 205 and 203. Buried P type region 301 serves as a reduced surface field (RESURF) region for both transistors. In other embodiment, only one transistor would be shown in FIG. 4 where gates 403 and 407, body contact regions 413 and 421, source regions 415 and 419, and P well regions 117 and 118 are physically connected to their respective structures and regions on each side of N well 119.

After the stage of FIG. 4, silicide structures are formed on the source regions, drain regions, body contract regions, and gates for electrically coupling of those regions and structures. Interconnect structures are formed over wafer 101 for electrically interconnecting the silicide structures to other devices formed on wafer 101 to external connectors such as bond pads (not shown) that are formed on wafer 101. In some embodiments, conductive field plates (not shown) maybe be located above the top surface of wafer 101 (at the stage shown in FIG. 4) in the interconnect layers with at least portions located directly above the drift regions 201, 203, and 205. In some embodiments, the field plates act to provide a RESURF effect by depleting the N type drift regions form the top during operation. In some embodiments, these field plates may be electrically tied to the source regions 415 and 419.

After the formation of the interconnect layers, wafer 101 is singulated into multiple die with each die including transistors similar to those shown in FIG. 4. The die are packaged in semiconductor packages (e.g. leaded, leadless, BGA, QFN, QFP, or wafer level packaging). Although not shown or described, the manufacture of a die as described above may include a number of other processes such as cleaning processes.

Figure 5:
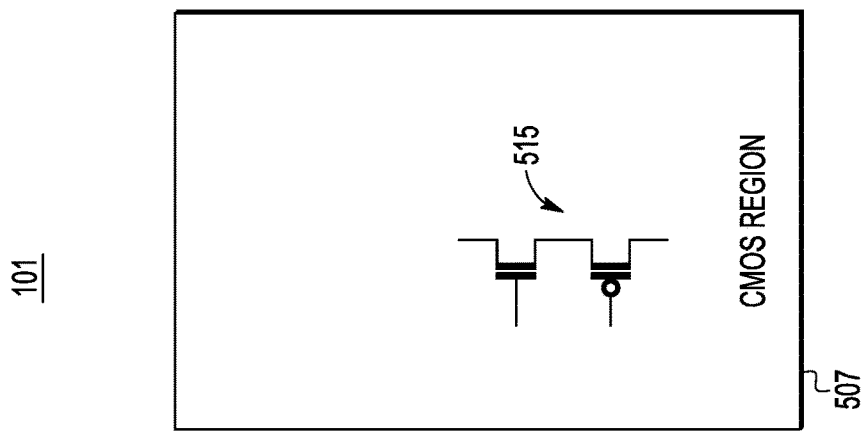
FIG. 5 is a partial top view of a wafer during the manufacture of a transistor according to one embodiment of the present invention.
Figure 5:
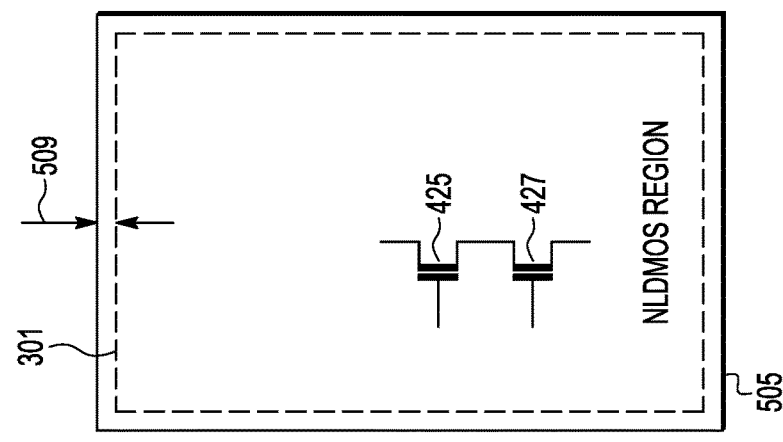
Figure 5:
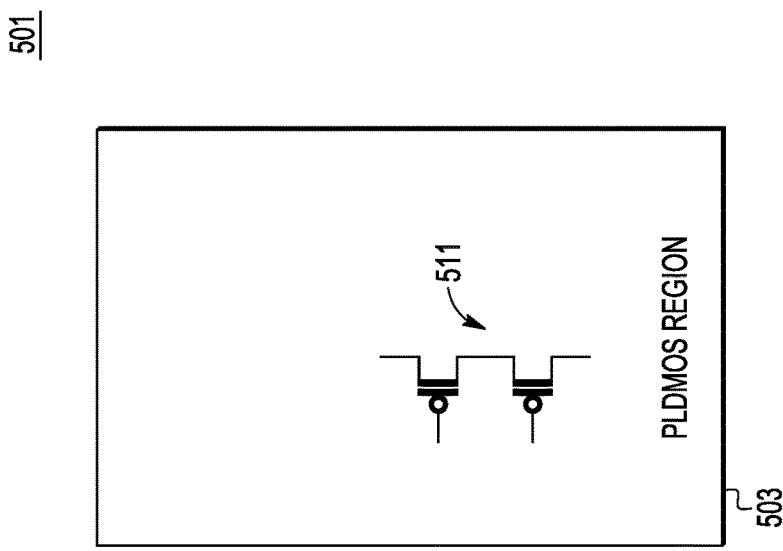

FIG. 5 shows a partial top view of wafer 101 with three active areas 503, 505 and 507. A plurality of P type extended drain transistors (represented by symbol 511) are formed in area 503. Extended drain N type transistors (including transistors 425 and 427) are formed in area 505. Area 507 includes a number of CMOS transistors (represented by symbol 515). An isolation structure 501 laterally surrounds each active area 503, 505, and 507 and includes openings for the active areas. In one embodiment, the isolation structure 501 extends at least from the top surface of layer 107 to the buried dielectric layer 105. In one embodiment, structure 501 is made of oxide and is formed by removing portions of layer 107 at selective locations and filling partly or entirely with oxide. Structure 501 can be made by other processes (e.g. LOCOS) in other embodiments. In the embodiment shown, each area is laterally surrounded by a single contiguous isolation structure (501) to provide dielectric isolation. However, in other embodiments, an active area may be laterally surrounded by dielectric isolation with multiple dielectric structures.

As shown in FIG. 5, buried P type region 301 (as implanted and activated) does not extend to the inner side of dielectric structure 501. As shown in FIG. 5, a lateral gap 509 exists between the inner side of structure 501 and the outer extent of region 301. In one embodiment, this lateral gap is at least 0.1 micron (e.g. 0.3 microns) after activation, but may be of other values in other embodiments depending on manufacturing tolerances. In one embodiment, leaving a lateral gap between the edge of region 301 and the inner side of structure 501 surrounding area 505 may provide a process that does not implant or otherwise drive P type dopants into the isolation structure 501 to undesirably charge the isolation structure during operation. However, in other embodiment, region 301 extends to the inner side of dielectric structure 501.

As shown in FIG. 5, the P type dopants that form region 301 are not implanted into areas 503 and 507. Utilizing an implantation process to implant the P type ions to form region 301 allows for the ability to selectively apply such a relatively heavy doping of P type ions in area 505, without affecting the other areas (503, 507) of wafer 101. If the P type doping concentration for region 301 was epitaxially grown or blanket implanted in layer 107, then the other N type regions (203, 119, 415, 419) of layer 107 would require a much heavier counter doping.

Referring back to FIG. 4, region 301 extends all the way directly under N drift regions 203 and N well region 119. However, in other embodiments, region 301 would not extend to directly under N well region 119. Also in some embodiments, region 301 would only partially extend under N drift region 203.

Figure 6:
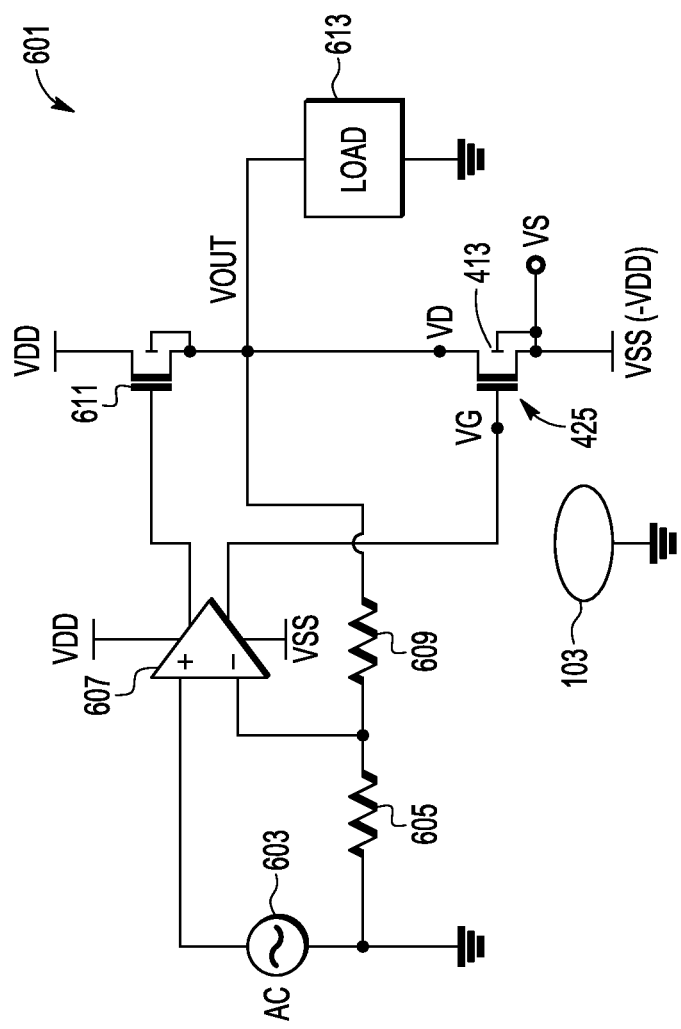
FIG. 6 is a circuit diagram of a circuit implementing a transistor according to one embodiment of the present invention.

FIG. 6 is a circuit diagram of circuit 601 that utilizes transistors 611 and 425 to provide a positive or negative voltage to a load 613. Circuit 601 is a symmetrical power supply that is capable of providing power to LOAD 613 at a voltage (VOUT) as high as VDD or as low as VSS (−VDD in the embodiment shown) during operation. In the embodiment shown, circuit 601 includes an AC source 603, resistors 605 and 609, an amplifier 607, extended drain transistor 611, and extended drain transistor 425. Amplifier 607 provides a differential output. AC source 603 provides an AC voltage to the non-inverting input of amplifier 607. The inverting input of amplifier 607 receives a feedback signal based on VOUT that is reduced by the voltage divider formed by resistors 605 and 609. Based on the voltage of AC source 603 and the voltage of VOUT, amplifier 607 provides a control signal to the gate of transistor 611 and a complementary control signal to the gate of transistor 425. The source of transistor 611 and the drain of transistor 425 are coupled together to provide a VOUT that ranges between VDD and VSS (−VDD in the embodiment shown) based on the voltage of the output of amplifier 607. In the embodiment shown, the feedback signal causes VOUT to track the voltage of AC source 603. During operation, the voltage of the complementary output of amplifier 607 can range from VSS to VDD. Accordingly, the gate voltage on transistor 425 can have the same voltage range.

Because the body contact 413 is tied to the source region 415, the voltage ($V_B$) of the body of transistor 425 is biased at the voltage ($V_S$) of the source region 415, which in the embodiment shown is −VDD. In the embodiment shown, substrate 103 of the die of transistor 425 is tied to ground. Accordingly, the source voltage is biased at a voltage below the substrate during operation. In some embodiments, VSS can be set at a voltage below ground (e.g. 0 to −200V) depending on the design of the circuit. In some embodiments, the voltage of substrate 103 can be biased to a voltage above ground and $V_S$ can be at ground. In the embodiment shown, the VSS voltage is continuously applied to the source region of transistor 425 and a ground voltage is continuously applied to substrate 103 during operation. In other embodiments, different voltages can be applied to either the source or substrate at different times during the operation of the circuit.

In one embodiment, circuit 601 provides an alternating voltage between VDD and VSS to an external load 613 which can be e.g. an output filter of an amplifier for a speaker or antennae. However, in other embodiments, circuit 601 can be used in other applications (e.g. communication system, industrial control systems, automobiles, RF applications). The use of extended drain transistors 611 and 425 allows for VOUT to have a wide voltage swing (e.g. 400 volts) and/or to have a high current capacity. In one embodiment, transistor 611 is located in another area (e.g. area 503 in embodiments where area 503 includes N type extended drain transistors like transistor 425) of the die isolated from area 505 by dielectric isolation structure 501 and amplifier 607 is located in area 507 of the die (See FIG. 5). Although in other embodiments, the devices may be implemented on separate die. In other embodiments, transistor 425 can be implemented in other types of circuits (e.g. in a power amplifier circuit for a communication system). In other embodiments, transistor 427 may be implemented with transistor 425 in parallel.

In some embodiments, an extended drain transistor (425) implemented on an SOI substrate (substrate 103 and layer 105) may advantageously provide for a semiconductor device capable of high side operation (source voltage above substrate voltage) and low side operation (source voltage below substrate voltage) with latch-up immunity. Such properties may in useful in failsafe circuits such as in automotive applications and/or inductively loaded drivers.

In some embodiments, forming a transistor in a semiconductor layer that is 2 microns or less may enable the formation of a transistor without the utilization of deep isolation trenches to achieve isolation of the transistor active areas (e.g. 503, 505, 507). Accordingly, a high voltage transistor capable of low side operation may be formed in a cost-efficient manner. Furthermore, in some embodiments, having a semiconductor layer 107 of 2 microns or less may allow for the formation of a transistor on a wafer without having to further epitaxially grow semiconductor material on a semiconductor layer 107, thereby reducing processing costs and complexities.

Utilizing a semiconductor layer (107) that is relatively thin with respect to the thickness of a buried dielectric layer (105) (e.g. where the ratio of the thickness of layer 107 to the thickness of layer 105 is 5 times or less) may provide for a high voltage transistor with desirable Ron*A characteristics where a double RESURF effect is utilized. "Ron" is the on-resistance in conductive state and A is the active transistor surface area.

In some extended drain transistors, a double RESURF effect is utilized to deplete the N type drift regions (e.g. 201, 203, 205, and a portion of layer 107 between region 301 and drift region 203 which acts as a drift region) from the top by a conductive field plate (located above wafer 101 in the view of FIG. 4 but not shown in FIG. 4) or from the top by an elongated gate structure (403 and 407) as well as from the bottom by the capacitance from a biased substrate (103)/buried dielectric layer (105) of an SOI substrate. However, the bottom RESURF effect from the bottom capacitance of the substrate/buried dielectric layer capacitance may be absent when the substrate (103) is biased at a voltage above the source region (415). As a result, the off-state breakdown voltage (BVdsOFF) decreases as the source voltage drops below the substrate voltage. This is especially problematic where the semiconductor layer (107), in which the transistor is formed, is relatively thin (e.g. 5 times or less the thickness of) as compared to the thickness of the buried dielectric layer (105).

In some embodiments, the p-n junction formed between the relatively heavily doped (e.g. dose in the range of $1 \times 10^{12}$ to $1 \times 10^{13}$ cm$^{-2}$ or higher in some embodiments) buried P type region (301) and the N type drift regions (201, 203, and 205 and a portion of layer 107) provides an additional bottom side RESURF mechanism for depleting the N type drift regions (201, 203, 205, and a portion of layer 107) from the bottom when the substrate voltage is above the source voltage (VS). Because region 301 is electrically connected to the P well region (117), region 301 is biased at the same voltage as the source region 415 during operation so as the provide the bottom RESURF mechanism even if the source voltage is below the substrate voltage. Also, in some embodiments, providing a relatively heavily doped buried P type region (301) may enable the N type drift regions 201, 203, 205, and a portion of layer 107 to be more heavily doped, which lowers drift region resistance and improves the Ron*A characteristics of the transistor. In some embodiments, adding a relatively heavily doped buried P type region may improve the BVdsOFF over a transistor without such a region by over 30% at source voltages greater than 50 Volts below the substrate voltage. In some embodiments, the buried P type region 301 is sufficiently doped (e.g. dose in the range of $1 \times 10^{12}$ to $1 \times 10^{13}$ cm$^{-2}$ or higher in some embodiments) that the N type drift regions 201, 203, 205, and a portion of layer 107 is fully depleted before the voltage gradients become high enough for junction breakdown to occur.

As used herein, when one object is "directly above" another object, it includes a portion that is above a portion of the another object in a line that is perpendicular and extends outward from a major active side of a substrate. For example, referring to FIG. 4, body contact region 413 is directly above region 121 but is not directly above N type drift region 203. Gate 403 is directly above N type drift region 201 but is not directly above region 413. When one object is "directly below" another object, it includes a portion that is below a portion of the another object in a line that is perpendicular and extends outward from a major active side of a substrate. In the embodiment of FIG. 4, N type drift region 201 is directly below gate 403 but is not directly below gate 407.

In one embodiment, a method of making a transistor includes forming a source region and a drain region of a transistor in a semiconductor layer of a wafer. The semiconductor layer is located over a buried dielectric layer of the wafer, and the buried dielectric layer is located over a semiconductor substrate of the wafer. The semiconductor layer has a first thickness of 2 microns or less. The source region and the drain region each have an N type net doping profile. The source region is formed in a P type well region of the semiconductor layer. The method includes forming an N type drift region of the transistor with an N type net doping profile in the semiconductor layer. During a conductive state of the transistor, a current path is formed between the drain region and the source region through the N type drift region. The method includes forming a dielectric isolation structure. The N type drift region including a portion located directly below the dielectric isolation structure. The method includes forming a gate structure of the transistor over the semiconductor layer and selectively implanting P type dopant ions into the wafer to form a buried P type region in the semiconductor layer. The buried P type region has a P type net doping profile. The buried P type region is located directly below at least a portion of the N type drift region of the transistor. The buried P type region is in electrical contact with the P type well region. The drain region, the source region, and the N type drift region are located in a first area of the wafer wherein the semiconductor layer of the first area is laterally surrounded by dielectric isolation. The buried dielectric layer electrically isolates the semiconductor layer of the first area from the semiconductor substrate.

Another embodiment includes a method for operating an extended drain transistor implemented in a die. The die includes a semiconductor layer, a semiconductor substrate, and a buried dielectric layer located between the semiconductor layer and the semiconductor substrate. The semiconductor layer has a first thickness that is 2 microns or less. The semiconductor layer includes a portion located in a first area of the die and is laterally surrounded by dielectric isolation. The portion of the semiconductor layer located in the first area includes a source region, a drain region, an N type drift region, and a buried P type region. The buried dielectric layer electrically isolates the portion of the semiconductor layer located in the first area from the semiconductor substrate. The method includes applying a first voltage to the semiconductor substrate and applying a second voltage to the source region concurrently with the applying the first voltage. The first voltage is greater than the second voltage. The buried P type region is located directly below the N type drift region and directly above the buried dielectric layer. The source region is located in a P type well in the portion of the semiconductor layer, the buried P type region is in electrical contact with the P type well region.

While particular embodiments of the present invention have been shown and described, it will be recognized to those skilled in the art that, based upon the teachings herein, further changes and modifications may be made without departing from this invention and its broader aspects, and thus, the appended claims are to encompass within their scope all such changes and modifications as are within the true spirit and scope of this invention.

What is claimed is:

1. A method of making a transistor comprising:
forming a source region and a drain region of a transistor in a semiconductor layer of a wafer, the semiconductor layer is located over a buried dielectric layer of the wafer, the buried dielectric layer is located over a semiconductor substrate of the wafer, wherein the semiconductor layer has a first thickness of 2 microns or less, wherein the source region and the drain region each have an N type net doping profile, wherein the source region is formed in a P type well region of the semiconductor layer;
forming an N type drift region of the transistor with an N type net doping profile in the semiconductor layer, wherein during a conductive state of the transistor, a current path is formed between the drain region and the source region through the N type drift region;
forming a dielectric isolation structure, the N type drift region including a portion located directly below the dielectric isolation structure;
forming a gate structure of the transistor over the semiconductor layer;
selectively implanting P type dopant ions into the wafer to form a buried P type region in the semiconductor layer, the buried P type region having a P type net doping profile, wherein the buried P type region is located directly below at least a portion of the N type drift region of the transistor, the buried P type region is in electrical contact with the P type well region;
wherein the drain region, the source region, and the N type drift region are located in a first area of the wafer wherein the semiconductor layer of the first area is laterally surrounded by dielectric isolation;
wherein the buried dielectric layer electrically isolates the semiconductor layer of the first area from the semiconductor substrate.

2. The method of claim 1 wherein the buried P type region contacts an upper surface of the buried dielectric layer.

3. The method of claim 1 wherein the selectively implanting includes implanting P type dopant ions at a dose in a range of $1 \times 10^{12}$ to $1 \times 10^{13}$ cm$^{-2}$.

4. The method of claim 1 wherein the buried dielectric layer extends to a second area of the wafer, the second area includes a P type transistor, wherein the selectively implanting does not include implanting P type dopant ions in the second area.

5. The method of claim 1 wherein the buried dielectric layer extends to a second area of the wafer, the second area includes an N type transistor, wherein the selectively implanting does not include implanting P type dopant ions in the second area.

6. The method of claim 1 wherein the dielectric isolation includes an inner side surrounding the area of the wafer, wherein the buried P type region is laterally separated from the inner side by at least a first distance.

7. The method of claim 6 wherein the first distance is 0.1 micron or greater.

8. The method of claim 1 wherein the semiconductor layer includes an N type well, the drain region located in the N type well, a first portion of the N type drift region is located on a first side of the N type well and a second portion of the N type drift region is located on an opposite side of the N type well, the buried P type region is directly below the first portion, the N type well, and the second portion.

9. The method of claim 8 wherein the buried P type region is not in electrical contact with the first portion, the N type well, and the second portion.

10. The method of claim 1, wherein the semiconductor layer includes a second P type well with a second source region located in the second P type well, wherein during a conductive state of the transistor, a current path is formed between the drain region and the second source region, wherein the buried P type region is in electrical contact with the second P type well.

11. The method of claim 1 wherein the buried P type region has a thickness in a range of 0.1-0.5 um.

12. The method of claim 1 wherein the buried dielectric layer has a second thickness, the first thickness being 5 times greater or less than the second thickness.

13. The method of claim 1 further comprising:
singulating the wafer into a plurality, wherein a die of the plurality of integrated circuit die includes the transistor.

14. The method of claim 1 wherein the buried P type region is directly below at least a portion of the drain region.

15. A method for operating an extended drain transistor implemented in a die with a semiconductor layer, a semiconductor substrate, and a buried dielectric layer located between the semiconductor layer and the semiconductor substrate, the semiconductor layer has a first thickness that is 2 microns or less, the semiconductor layer includes a portion located in a first area of the die and is laterally surrounded by dielectric isolation, the portion of the semiconductor layer located in the first area includes a source region, a drain region, an N type drift region, and a buried P type region, wherein the buried dielectric layer electrically isolates the portion of the semiconductor layer located in the first area from the semiconductor substrate, the method comprising:
applying a first voltage to the semiconductor substrate;
applying a second voltage to the source region concurrently with the applying the first voltage, wherein the first voltage is greater than the second voltage;
wherein the buried P type region is located directly below the N type drift region and directly above the buried dielectric layer, the source region is located in a P type well in the portion of the semiconductor layer, the buried P type region is in electrical contact with the P type well region.

16. The method of claim 15 wherein the first voltage in a range of 10 to 200 volts greater than the second voltage.

17. The method of claim 15 wherein the N type drift region is fully depleted when the first voltage is at a voltage in a range of 10-200 volts greater than the second voltage.

18. The method of claim 15 wherein the extended drain transistor is implemented in a power supply circuit, the method further comprising providing a negative voltage at an output of the power supply circuit coupled to the drain region.

19. The method of claim 18 wherein the power supply circuit includes a second extended drain transistor in series with the extended drain transistor, wherein the second extended drain transistor is implemented in a second area of the die with the dielectric isolation located laterally between the first area and the second area.

20. The method of claim 15 wherein the buried dielectric layer has a second thickness, the first thickness being in a range from 5 times greater or less than the second thickness.

* * * * *